United States Patent [19]

Salib et al.

[11] Patent Number: 5,070,304
[45] Date of Patent: Dec. 3, 1991

[54] DISTRIBUTED COMBINER POWER AMPLIFIER AND METHOD

[75] Inventors: Mike L. Salib, Millersville; Marvin Cohn, Baltimore, both of Md.

[73] Assignee: The United States of America as represented by the Secretary of the Air Force, Washington, D.C.

[21] Appl. No.: 543,919

[22] Filed: Jun. 21, 1990

[51] Int. Cl.$^5$ ............................................. H03F 3/60
[52] U.S. Cl. ...................................... 330/54; 330/395; 330/124 R; 330/277; 330/53
[58] Field of Search ................... 330/54, 295, 124 R, 330/277, 53, 286

[56] References Cited

U.S. PATENT DOCUMENTS

| | | | |
|---|---|---|---|
| 4,291,286 | 9/1981 | Wagner | 330/54 |
| 4,532,480 | 7/1985 | Gerard | 330/286 |
| 4,564,817 | 1/1986 | Gilson et al. | 330/286 |
| 4,595,882 | 6/1986 | Silagi et al. | 330/151 |
| 4,868,520 | 9/1989 | Terakawa et al. | 330/54 |

OTHER PUBLICATIONS

Broadband Monolithic MIC Power Amplifier Developement, Marvin Cohn et al., Microwave Journal, 3/1982, pp. 89-94.

Primary Examiner—Eugene R. Laroche
Assistant Examiner—Tan Dinh
Attorney, Agent, or Firm—Gerald B. Hollins; Donald J. Singer

[57] ABSTRACT

An improved distributed amplifier usable, for example, in the gigahertz frequency range for radar and electronic warfare applications is disclosed. In the amplifier stage a combination of optimum amplifier stage loading, a reflection cancelling output network, and an amplifier capacitance hiding input arrangement are employed. The disclosure includes specific component values for one embodiment of the invention.

20 Claims, 3 Drawing Sheets

DISTRIBUTED COMBINER POWER AMPLIFIER AND METHOD

RIGHTS OF THE GOVERNMENT

The invention described herein may be manufactured and used by or for the Government of the U.S. for all governmental purposes without the payment of any royalty.

BACKGROUND OF THE INVENTION

This invention relates to the field of electronic amplifier circuits, particularly to the type of amplifiers used in wideband systems in portions of the radio frequency spectrum above one gigahertz.

Distributed amplifiers in which a plurality of individual amplifier circuits are disposed between taps of an input and an output delay line offer several advantages over more conventional amplifier arrangements, especially when the signal to be amplified is in the gigahertz or higher frequency range, that is, in the frequency band that is often used for radar and similar apparatus. A notable advantage of such amplifier arrangements is their ability to accommodate the input capacitance encountered with transistors, vacuum tubes and other "active" elements used in signal amplification. The ability to regard this amplifier active device input capacitance as being a portion of the input delay line structure and, therefore, not a direct limitation on the frequency response of the amplifier is a particularly notable advantage of the distributed amplifier configuration. As a result of this "hiding" of input capacitance, distributed amplifiers are capable of unusually large operating bandwidths and flat gain versus frequency response.

When considered in some technical detail, however, a number of practical limitations and disadvantages are found to attend most distributed amplifier arrangements. Included is the attainment of undesirably low operating efficiencies, especially a value of power added efficiency $[(P_{output} - P_{input})]/[V_{bias} \times I_{bias}]$ which is often in the range of 5 to 10 percent.

The low power added efficiency in most distributed amplifier arrangements is a result of the amplifier active devices, that is the amplifier transistors, for example, all consuming DC power even though only about half of the number are producing maximum power output. Frequently this condition is the result of less than optimum loading for many of the distributed amplifier transistors. As a result of these difficulties the prior art has been unable to provide a distributed amplifier arrangement efficient enough to be considered in situations requiring a high efficiency wide band power amplifier, particularly in military and other state of the art equipment.

The prior patent art reveals considerable inventive effort in the field of distributed amplifiers and related apparatus. Particularly notable among the prior patent examples is the patent of R.A. Gilson et al, U.S. Pat. No. 4,564,817, which concerns a distributed amplifier of the above referred-to tapped input delay line and tapped output delay line variety and wherein the amplifying devices connected between respective delay line taps are field effect transistors. The '817 patent is especially concerned with an amplifier arrangement which may be fabricated on a monolithic or single wafer substrate member. The '817 patent also includes a number of refinement such as the use of Gallium arsenide as the substrate fabrication material for the transistors and the delay line and the possible use of two output delay lines in lieu of the more conventional single output delay line.

The prior patent art also includes the patent of R.E.J. Gerard, U.S. Pat. No. 4,532,480, which concerns a power amplifier arrangement similar to a distributed amplifier in which a plurality of field effect transistors that are driven from the taps of an input delay line, drive a segmented output delay line by way of power combiner circuits disposed between the amplifier transistors and the delay line. The '480 patent also contemplates the use of a cascode connected transistors amplifier pair and the use of a power combiner network which includes a tapped winding transformer element. The '480 patent is also concerned with reflected energy and the resulting output Voltage Standing Wave Ratio (VSWR) degradation, and provides accommodation for such reflected energy by way of amplifier shunting resistances. The '480 patent teaches a number of unusual attributes for a distributed amplifier including successively lower impedance levels at the output of each adjacent amplifier stage, the mixture of FET and bipolar transistors in the cascode amplifiers, use of a transformer power combiner, polarized windings for the combiner transformer, and consideration of the input delay line as a filter network [see column 4, line 41]. The distributed amplifier of the instant invention is distinguished from the amplifier of the '480 invention by the differing arrangement of signal combiners and output delay line sections, the use of constant impedance levels, and by the differing accommodation of output encountered reflection signals. In addition, the present invention amplifier is distinguished over the Gerard amplifier by its incorporation of optimum output impedance loading for each 3 terminal active element of the amplifier. The optimum loading in each element yielding maximum output power. Furthermore, since neither the input RF drive level nor the applied DC power are significantly affected, the composite amplifier's gain in power added efficiency as well as power output is increased.

The patent of G.L. Wagner U.S. Pat. No. 4,291,286 also describes a distributed amplifier like arrangement which is identified as a high bandwidth transversal filter in which active amplifier devices are connected between the taps of an input and an output delay line. In keeping with its function as a transversal filter the '286 patent provides a gain weighting factor in association with each of the different amplifier stages. These weighting factors are determined by the drain current of the FET transistor or by a capacitive voltage divider. The '286 patent employs the output delay line as both an additional delay and in the function of a high bandwidth signal summing device. The FETs of the '286 patent therefore function to provide high impedance loads at the input delay line taps, serve as weighted amplifiers, and act as part of the input and output impedance matching networks. The instant invention is distinguished over the disclosure of the '286 patent by its use of a delay line-combiner arrangement, by the improved loading provided for the amplifier transistors, by the gain adjustment in selected of the amplifier circuits, and by the single transistor amplifier stages, and other distinctions.

SUMMARY OF THE INVENTION

In the present invention a distributed combiner amplifier which achieves improved operating efficiencies, and higher output power and gain than a conventional distributed amplifier while retaining a low input VSWR is provided. The distributed amplifier of the invention employs optimum transistor loading including each transistor in the distributed amplifying chain along with equalization of the transistor input signals and achieves desirable low output VSWR resulting from reflected signal cancellation in a plurality of output delay line segments.

It is an object of the present invention therefore to provide a distributed amplifier capable of increased operating efficiency, especially increased power added operating efficiency as well as increased power output.

It is another object of the invention to provide a distributed amplifier in which the active amplifying devices are utilized to a greater and more efficient degree than has been practiced heretofore.

It is another object of the invention to provide a distributed amplifier which provide higher gain than conventional amplifiers, such higher gain being partially the result of optimum loading of the amplifier transistors.

It is another object of the invention to provide a distributed amplifier in which cancellation of reflected signals in the output combining apparatus attenuates reflected energy and provides low output voltage standing wave ratio characteristics.

It is another object of the invention to provide a distributed amplifier arrangement in which a circuit other than a delay line is used in collecting the output signals of the distributed amplifying devices.

It is another object of the invention to provide a distributed amplifier in which the achieved bandpass is improved over that of nondistributed amplifiers.

Additional objects and features of the invention will be understood from the following description and the accompanying drawings.

These and other objects of the invention are achieved by a distributed power amplifier apparatus which includes means for generating an n plurality of time displaced signal samples of the power amplifier input signal; n plural amplifier means for increasing the magnitude of each said n time displaced signal sample; delay equalizing means including n plural delay elements of unequal delay path length connected one with the output of each said n plural solid state amplifier means for equalizing the phase relationship among the amplifier output signals and for dissimilar path length cancellation of signal reflections from said n plural amplifier means; and real-time network means for combining the delay equalized output signals of said n plural amplifier means into a unitary output sign

DETAILED DESCRIPTION

Figure 1:
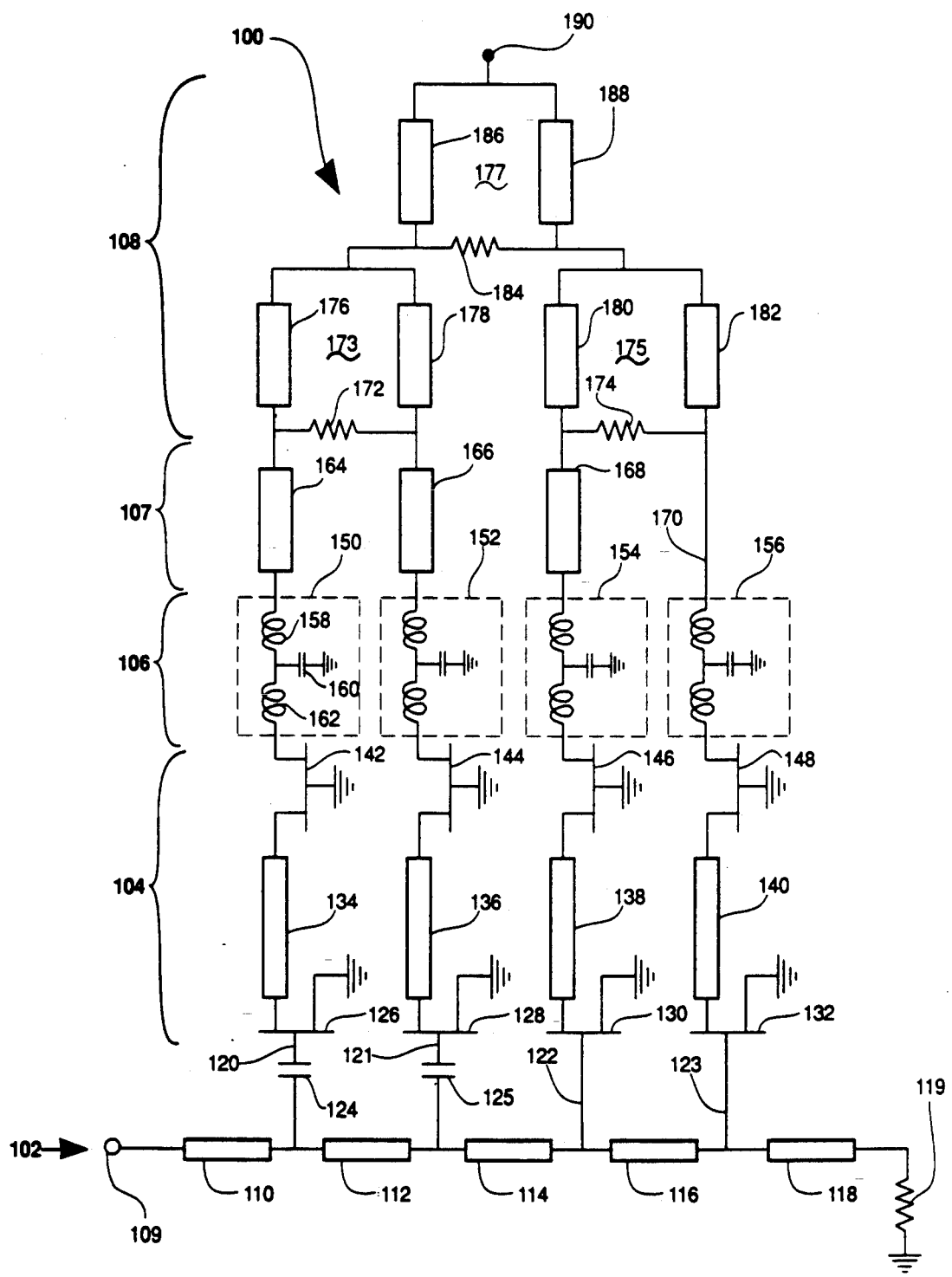
FIG. 1 shows a combined blocked diagram of a distributed amplifier made in accordance with the invention.

FIG. 1 in the drawings shows a schematic diagram of a distributed amplifier made in accordance with the invention, an amplifier that is arranged to operate over a passband of 10 to 20 gigahertz and to provide an output power of about 18.5 dBm across the 12 to 18 gigahertz portion of this band. The FIG. 1 distributed amplifier 100 is comprised of the five major portions indicated at 102, 104, 106, 107, and 108 in FIG. 1. These portions generally comprise the input delay line 102, the group of 4 cascode connected FET transistor amplifiers indicated at 104, the group of 4 amplifier output matching networks indicated at 106, and the power combining network indicated at 108. Each of these portions of the FIG. 1 amplifier are described in greater detail in the following paragraphs.

The input delay line 102 in FIG. 1 is shown to include five delay line sections 110, 112, 114, 116, and 118. These delay line sections may be fabricated, for example, from Microstrip delay line and are provided with electrical values in this example of ninety degrees at 15 gigahertz for the section 110 and fifteen degrees at 12 gigahertz for the each of the section 112, 114, and 116 and a value of eleven degrees at 12 gigahertz for the section 118. The terminating resistance for the input delay line is shown at 119 in FIG. 1 and preferably has a resistance value equal to the characteristics impedance of the delay line, a value of 50 ohms, for example.

Each of the amplifiers of the group 104 in FIG. 1 are shown to include a pair of FET transistors which are connected into a cascode configuration; that is, a configuration wherein the first transistor of the pair is operated in the grounded source configuration and the second transistor is operated in a grounded gate configuration and with the drain terminal of the first transistor being connected to the source terminal of the second transistor. The input transistors of the cascode connected pairs are indicated respectively at 126, 128, 130, and 132 in FIG. 1 and the grounded base output transistors are indicated respectively at 142, 144, 146, and 148.

Shown at 134, 136, 138, and 140 in FIG. 1 are four interstage matching networks which serve to more efficiently couple the relatively high impedance output port of the first transistor in the cascode pair to the relatively low input impedance of the second transistor in the cascode pair. This matching network is preferably disposed in the form of another length of microstrip transmission line, a length having the electrical impedance of 80 ohms at 31 degrees for a frequency of 12 gigahertz in the amplifier shown in FIG. 1.

Figure 2:
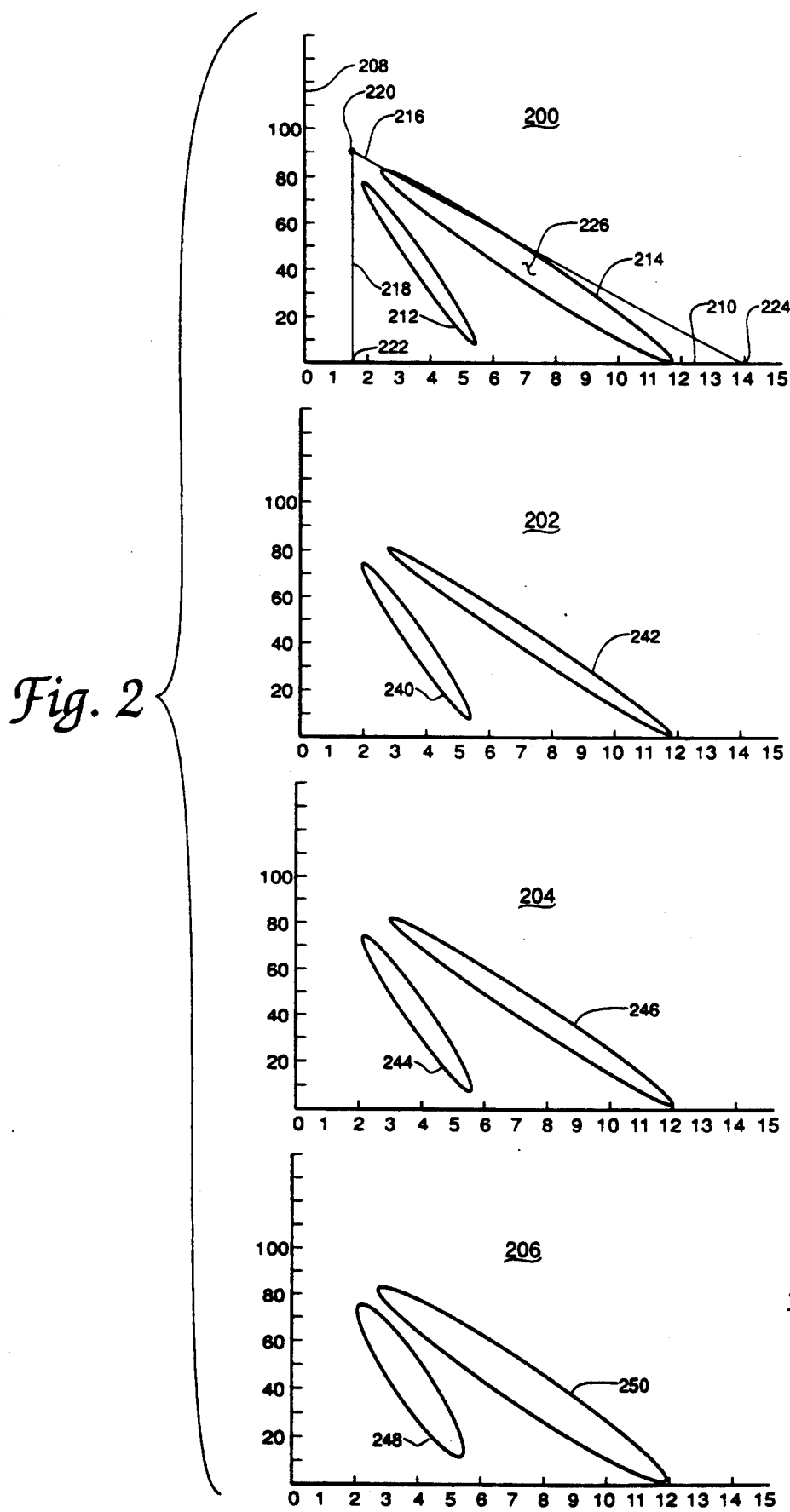
FIG. 2, with the views of FIG. 2A, 2B, 2C, and 2D shows frequency dispersed dynamic load lines for the first and second transistors of a cascode amplifier usable in the invention.

Additional matching network information in the form of a set of dynamic load lines for each of the transistors in the cascode connected pairs over a band of operating frequencies is shown in FIG. 2 herein and as is described below. The interstage networks 134, 136, 138 and 140 in FIG. 1 serve to optimize the large signal performance of each cascode amplifier pair. Additional and specific information with regard to the details of this optimization will be understood from the discussion of transistor dynamic load lines presented in conjunction with FIG. 2.

Input signal to the cascode connected amplifiers is communicated from the taps of the delay line 102 to the gate terminal of the input transistor by way of the paths 120, 121, 122, and 123 in FIG. 1. Two of the paths, the paths 122 and 123 are direct coupled while the additional two, the paths 120 and 121 include signal attenuating elements such as the capacitors 124 and 125. The capacitor 124 may have a value of 1.1 picofarad and the capacitor 125 a value of 1.4 picofarad in order that the larger clone signal appearing at the first delay line tap be attenuated the greatest amount and, therefore, arrive at the transistor gate terminal with the same amplitude as that of the other clone signals. Attenuation and selective gain adjustment of the signals from the later delay line taps, the signals on the paths 122 and 123, is not required since these signals are nearly equal in amplitude.

In order to efficiently couple energy from the relatively high output impedance of the grounded gate connected second of the cascode connected transistors 142, 144, 146, and 148 to the low impedance of about 50 ohms desired at the distributed amplifier output terminal 190 and in the power combining network 108 it is desirable to use some form of a matching network. At the frequencies described for operating the FIG. 1 amplifier the Tee networks shown at 150, 152, 154, and 156 in FIG., 1 may be used for this impedance matching function. For the Tee network elements at 158, 160, and 162 in the typical network 150, the Tee may comprise inductances of 0.55 nanohenrys and 1.2 nanohenrys at the output and input terminals of the network respectively with a shunt capacitance of 0.166 picofarad connecting the junctions of the inductors to the signal common ground. At an operating frequency of 15 gigahertz these component values provide a load impedance of 140 ohms for each of the second transistors of the cascode pair; this is the load that produces the maximum output power from each of the cascode connected amplifier sections.

The delay equalization lines 107 in FIG. 1 provide the necessary phase equalization function during operation of the FIG. 1 amplifier. As is indicated at path 170, and for the delay lines 168, 166, and 164, each of the cascode amplifiers in the distributed amplifier in FIG. 1 is, in fact, provided with an equalization delay of different time value. In accordance with these differing time values the delay line 164 may desirably provide an electrical characteristic of one hundred thirty degrees of phase shift at a frequency of 12 gigahertz, the delay line 166 provide ninety degrees of phase shift at 12 gigahertz, and the delay line 168 forty degrees of phase shift at 12 gigahertz. Each of these delay lines also has a 50 ohm characteristic impedance.

Considered from an overall perspective, the direct coupling of the path 170 and the successively greater increments of delay provided by each of the lines 168, 166, and 164 provide compensation for the delay of the signal taps along the delay line 102. According to this arrangement, the long delay of the equalization line 164 compensates for the early tap position of the signals in the path 120 and so on. It may be noted that the difference between the delay of the direct path 170 and the adjacent equalization line 168 is forty degrees of phase shift at a frequency of 12 gigahertz while the difference between the delay of the line 168 and the line 166 is fifty degrees of phase shift at 12 gigahertz and the delay difference between the line 166 and the line 164 is again forty degrees of phase shift. The non-constant value of this difference between adjacent line delays is a result of the inductors used in series with the cascode input. This inductor is used to step up the voltage at the FET to compensate for the input line attenuation.

It is intended, of course, that the output of the equalizing delay lines 164, 166, 168 and the direct path 170 be clone signals of the delay line input signal and that these clone signals be in phase or phase synchronized when applied to the bilateral, real-time power combining network 108. In addition to providing this phase synchronization, in the signals applied to the power combiner 108, the unequal length delay lines in the array 107 also serve a useful purpose in the case of mismatched loads connected to the amplifier output terminal 190. Since the signals reflected back into the FIG. 1 amplifier by a mismatched load propagate through the arms of the combiner 108 and through the differing delay paths of the array 107 to be reflected back from the transistor output nodes, a vectorial cancellation of these reflected signals is to be expected at the combiner output. Most of the energy invested in the reflection signals is therefore dissipated as heat in the output combiner isolation resistors. The vectorial cancellation enabled by such dissipation, therefore, contributes to the attainment of desirable low output voltage standing wave ratio in the FIG. 1 amplifier even in the presence of a mismatch between the amplifier and the applied load.

The power combiner array 108 in FIG. 1 is shown to comprise 3 similar electrical networks that are connected into a two layer or two stage combiner network. The network 173 is typical of the three employed networks in the combiner and consist of the two ninety degree at 15 gigahertz delay line elements 176 and 178 together with the 100 ohms resistive element 172. The similar elements for the networks 175 and 177 are shown at 180, 182, and 174 for the network 175 and at 186, 184, and 188 for the network 177. The three networks 173, 175, and 177 of the power combiner 108 are disposed in a configuration which has become known in the art as a Wilkinson combiner. The delay lines 176, 178, 180, 182, 186, and 188 of the power combiner may have an electrical phase shift characteristic of 90 degrees at 15 gigahertz and a 70 ohm characteristic impedance. Electrical properties such as these are conveniently obtained from short lengths of Microstrip delay line. The resistive elements 172, 174, and 184 may have DC resistance values of 100 ohms each. Other combiner networks, in addition to the Wilkinson combiner, can, of course, be employed in the FIG. 1 amplifier.

Since input signals at any one of the power combiner input terminals proceed in synchronism with signals appearing at the remaining three terminals to simultaneously reach the output terminal 190, the combiner 108 may be regarded as a real-time network. Additionally, since signals may be transmitted in either direction through the powered combiner network 108, that is, from the four input terminals to the one output terminal, or alternately from the one output terminal to each of the four input terminals, the illustrated combiner network and similar networks are fairly described as being bilateral in nature. As described above, herein, this bilateral nature is involved in the bidirectional transmission of, and cancellation of, reflected energy signals arising from a mismatched load at the output terminal 190.

The four amplifier or four signal path arrangement shown for the distributed amplifier of FIG. 1 may, of course, be expanded upon or modified so that a number of signal paths other than four may be employed. Since it is desirable to excite the amplifiers 104 with signals of equal power level, embodiments of the FIG. 1 amplifier having more than about six amplifier paths are somewhat difficult to achieve since increased attenuation of the input signal with each successive tap of the delay line 102 is to be expected.

FIG. 2 in the drawings shows large signal dynamic load lines for the transistors of the cascode amplifiers 104 in FIG. 1-under four different sets of amplifier operating conditions. In the family of curves 200 in the view of FIG. 2A, for example, transistor current is plotted along the vertical axis 208 and transistor drain to source voltage is plotted along the horizontal axis 210. In the family 200, the curve 212 represents operating conditions for one of the input transistors 126, 128, 130, and 132, and the curve 214 represents the operating conditions of one of the output transistors 142, 144, 146, and 148 in the cascode pairs. As indicated by the nonzero area within the load line curves 212 and 214 each of the cascode amplifier transistors, that is the transistors 126 and 142, for example, operates into a somewhat nonresistive or reactive load.

One significance of the operating curves 212 and 214 may be appreciated by realizing that a desired region of operation for a typical transistor usable in the FIG. 1 amplifiers can, for example, be represented by the hypotenuse of the FIG. 2 triangular region that is bound by the straight lines 216 and 218 and the axis 210. This triangular region is also defined by one hundred milliamperes of maximum drain current at 1.5 volts of knee voltage at the point 220 and the point 224 which represents 14 volts and zero current flow in the transistor drain element. For optimal amplifier operation therefore it is desirable that the output transistor load lines remain close to the hypotenuse straight line connecting the points 220 and 224 and that the amplifier operate over as large of a portion of this line as possible.

By way of the optimized loads described above for the transistors of the FIG. 1 cascode pairs, the operating regions represented by the curves 212 and 214 in FIG. 2A are obtained. This condition is more satisfactory than the dynamic operating characteristics usually encountered in distributed amplifier circuitry and thereby illustrates the benefits of using the cascode output matching network array 106 and the array of cascode interstage matching networks 134, 136, 138 and 140 in FIG. 1.

Figure 3:
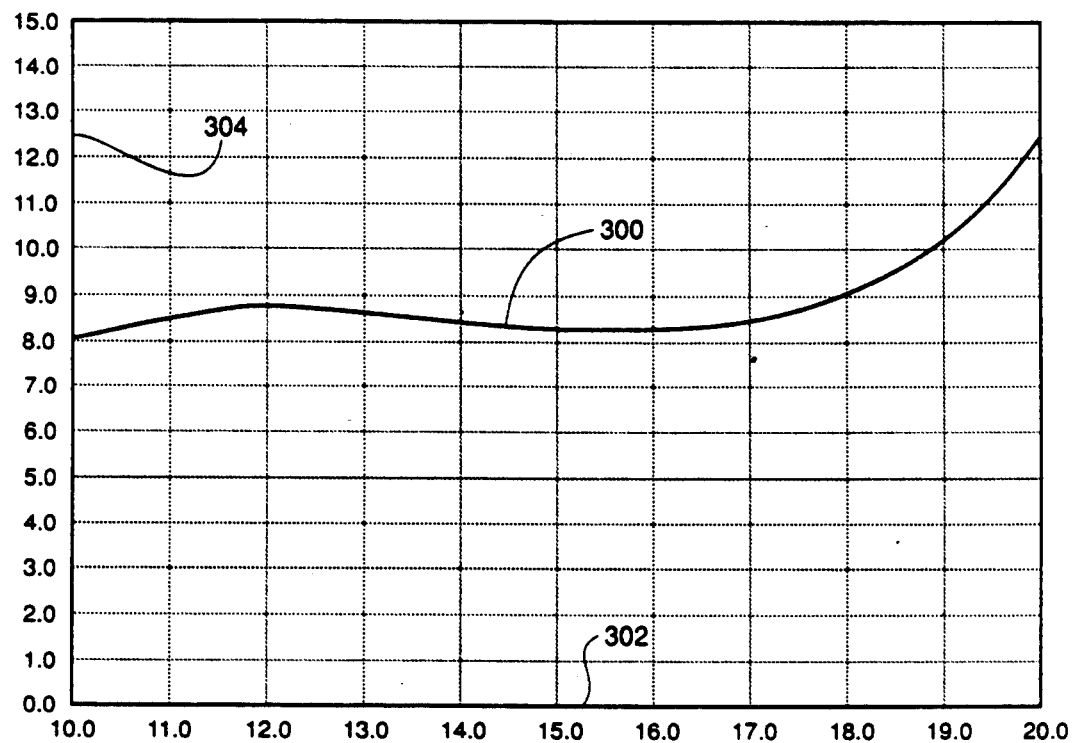
FIG. 3 shows a bandpass characteristic for distributed amplifiers made in accordance with the invention.

The curves 212 and 214 in FIG. 2A represent the transistor operation achieved with an input current of 0.045 amperes, an input frequency of 12 gigahertz, and a power output of 18.64 dBm. Moreover, the overall output of the amplifier in FIG. 2 and FIG. 3 is 24.2 dBm and the small signal gain is 8 to 9 db across the band. The calculated power added efficiency is 18% at an operating frequency of 18 gigahertz.

The families of curves 202 shown in FIG. 2B represent the input transistor dynamic load line at 240 and the output transistor dynamic load line 242 with an input current of 0.046 amperes a power output of 18.49 dBm and a frequency of 14 gigahertz. In a similar manner in the family of curves 204 in FIG. 2C, the curve 244 represent the input transistor load line and the output transistor load line and is represented at 246. The family of curves 204 represents an input current of 0.048 amperes a power output of 18.43 dBm and a frequency of 16 gigahertz. Additionally, in FIG. 2D the family of curves 206 represents the input transistor dynamic load line at 248 and the output transistor dynamic load line at 250 with an input current of 0.051 amperes, a power output of 18.5 dBm, and an operating frequency of 18 gigahertz. The larger areas inside the dynamic load lines that are associated with higher frequency that is, the increased enclosed area between FIG. 2A and FIG. 2D, indicate the effect of increasing frequency on the reactive components of the transistor loads. The increased areas of the ellipses represent less output power of the amplifier as a result of a reactive part of the load that is not matched out completely at the operation frequency.

FIG. 3 shows the small signal gain response of the FIG. 1 amplifier over a large band of possible operating frequencies. As indicated by the curve 300 in FIG. 3, the amplifier passband is flat within about ½ dB over the central 12 to 18 gigahertz portion of this operating frequency band. In the FIG. 3 drawings the amplifier gain is measured along the vertical axis 304 which is graduated in decibels and frequency is measured along the horizontal axis 302 which is calibrated in increments of one gigahertz. As also indicated in FIG. 3 the small signal gain of the FIG. 1 amplifier is in the range of 8 to 9 decibels over a major portion of the illustrated broad passband.

Figure 4:
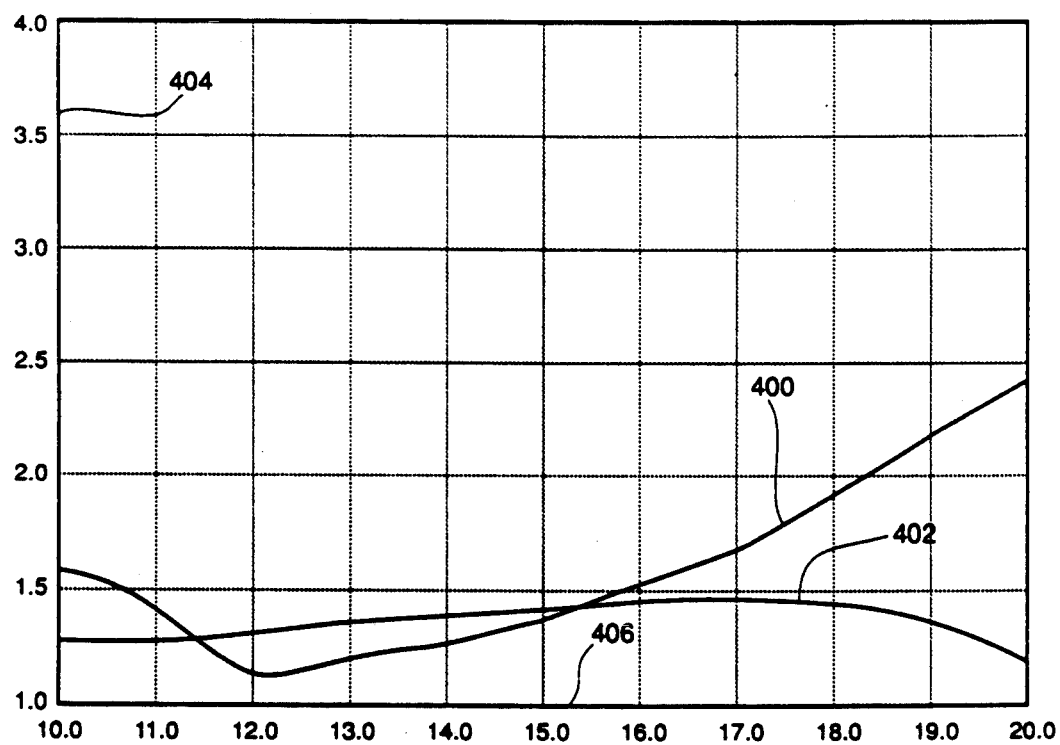
FIG. 4 shows the variation of input and output VSWR characteristics with frequency for a distributed amplifier made in accordance with the invention.

FIG. 4 in the drawings shows the output and input values of VSWR for the FIG. 1 distributed amplifier. In FIG. 4 the values of VSWR are measured along a vertical scale 404 and amplifier operating frequency measured along the horizontal scale 406 which is coincident with the scale 302 used in FIG. 3. Values of output voltage standing wave ratio are represented by the curve 400 in FIG. 4 while input VSWR values are represented by the curve 402. Both the input VSWR ratio of 1.5 or less and the output ratio of 1.9 or less over the central 12 gigahertz to 18 gigahertz portion of the FIG. 4 frequency band are notably low and are desirable attributes of the FIG. 1 amplifier.

It is especially notable that the FIG. 4 indicated values of output VSWR are achieved even though the employed cascode amplifier pairs present an output impedance which is close to that of an open circuit, a high output impedance. These low values of output VSWR result from the above described partial or total cancellation of energy reflected from the constituent amplifying branch amplifiers-cancellation which results from the differing signal path lengths in the equalization delay lines 107. This energy is dissipated in the Wilkinson combiner resistors. The low values of input VSWR indicated in FIG. 4 arise from the distributed amplifier input configuration shown in the FIG. 1 amplifier. The above noted substantially higher gain for the FIG. 1 amplifier and the noted 24.2 dBm overall output level from the FIG. 1 amplifier and also the 18 percent power added efficiency result from terminating the transistors in the amplifier array 104 with an optimum load impedance. Indeed the operating bandwidth of the FIG. 1 amplifier is limited principally by the ability to synthesize output networks that provide the optimum output impedance over a selected wide bandwidth.

ADVANTAGES

Several advantages including those of the following list are realized from an amplifier of the herein described type.

Greater power added efficiency is achieved in the amplifier in comparison with a conventional distributed amplifier. Maximum power output of the employed field effect transistors is utilized and each transistor is moreover terminated with a load impedance optimized for maximum power output according to load pull theoretical analysis.

2. Desirably low input VSWR values are achieved. The distributed parameter input transmission line wherein amplifier input capacitances can be "hidden" as part of the transmission line reactive elements contributes to this arrangement.

3. Desirably low output VSWR, even in the presence of load mismatching. The energy reflected by a mismatched load is phase displaced in the differing delay tracks and dissipated in combiner isolation resistors.

4. Higher signal gain than in conventional distributed amplifiers. The higher impedance loads provided in the amplifier enable the higher gain than arrangements wherein amplifiers drive loads of the output delay line impedance level.

5. The number of signal paths in the amplifier may be selected according to application requirements and is not limited to the 3 or 4 path configurations used in many prior distributed amplifiers. The number of paths in the present amplifier is limited only by the need to equally excite each of the input transistors.

6. Bandwidth limitations in the FIG. 1 distributed amplifier originate largely in the output matching network of the individual amplifiers. An optimum match is achievable over at least an octave of bandwidth.

ALTERNATE ARRANGEMENTS

Variations of the FIG. 1 amplifier are possible within the scope of the invention. As would be apparent to persons skilled in the electronic art, for example, the capacitors 124 and 125 in FIG. 1 might readily be replaced with the use of delay lines or inductive elements. In addition, output combining networks other than the illustrated Wilkinson combining network may be employed in the output portion of the invention amplifier. Three terminal amplifying devices other than FETs can also be used in the described Distributed Combiner Amplifier.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:

1. Distributed radio frequency power amplifier apparatus comprising the combination of:
   a signal delay line connected to a source of power amplifier input signals, said delay line including an n plurality of delayed signal taps spaced therealong;
   an n plurality of signal amplifier circuits each including an output terminal and an input terminal that is connected with one of said delay line delayed signal taps;
   an n plurality of impedance matching networks each having an output terminal and an input terminal that is connected with one of said signal amplifier circuit output terminals;
   an n−1 plurality of delay equalization delay lines each having an output terminal and an input terminal that is connected to one of said impedance matching network output terminals; and
   a signal power combining network having an output terminal and an n plurality of input terminals with n−1 of said input terminals being connected with one of said delay equalization delay line output terminals and the nth of said input terminals being connected directly with the unconnected nth impedance matching network output terminal.

2. The power amplifier apparatus of claim 1 wherein each of said n signal amplifier circuits includes a plurality of active amplifier devices and an interstage impedance matching coupling network connected between two of said active amplifier devices.

3. The power amplifier apparatus of claim 2 wherein each of said n signal amplifier circuits includes two transistors connected into a cascode amplifier circuit and wherein said interstage impedance matching coupling network is connected between the output terminal of a first one of said transistors and the input terminal of the second one of said transistors.

4. The power amplifier apparatus of claim 3 wherein said transistors are gallium arsenide field effect transistors.

5. The power amplifier apparatus of claim 3 wherein each one of said n plurality of impedance matching networks includes Tee network means for coupling a high impedance output signal port of a cascode connected amplifier circuit with a lower impedance level input terminal, of said signal power combining network.

6. The power amplifier apparatus of claim 5 wherein each of said n plurality of impedance matching networks include series inductive input and output arm and shunt capacitive member means for maximizing the cascode amplifier output power.

7. The power amplifier apparatus of claim 4 wherein said n plurality consists of four.

8. Distributed power amplifier apparatus comprising the combination of:
   means for generating an n plurality of time displaced signal samples of the power amplifier input signal;
   n plural amplifier means for increasing the magnitude of each said n time displaced signal samples;
   delay equalizing means including n plural delay elements of unequal delay path length connected one with the output of each said n plural solid state amplifier means for equalizing the phase relationship among the amplifier output signals and for dissimilar path length cancellation of signal reflections from said n plural amplifier means; and
   real-time network means for combining the delay equalized output signals of said n plural amplifier means into a unitary output signal.

9. The power amplifier apparatus of claim 8 wherein said network means includes n input nodes, one output node and n symmetrically disposed signal paths between input and output nodes.

10. The power amplifier apparatus of claim 9 wherein said n plurality is four in number and wherein said network means includes three three-terminal passive element signal combining arrays disposed in two-layered tandem.

11. The power amplifier apparatus of claim 10 wherein said passive element signal combining arrays each include a resistive element and a predetermined reactive element.

12. The power amplifier apparatus of claim 8 wherein said means for generating an n plurality of signal samples includes a tapped delay line.

13. The power amplifier of claim 8 wherein said amplifier means each include a plurality of active amplifying devices and means for optimizing the load applied to each said amplifying device.

14. The power amplifier of claim 8 wherein said delay equalizing means delay elements comprise delay lines of predetermined delay duration.

15. The power amplifier of claim 13 wherein said means for optimizing the load applied to each said amplifying device includes Tee connected inductive and capacitive network means for coupling a high output impedance amplifier circuit with a predetermined low input impedance signal combining network.

16. The power amplifier of claim 8 wherein said means for generating an n plurality of time displaced signal samples includes a tapped delay and filter network and wherein said n plural amplifier means includes n plural amplifier circuits each having an input reactance comprising a portion of said tapped delay and filter network.

17. The method of operating a distributed radio frequency power amplifier comprising the steps of:
    generating an n plurality of clone signals each of successively increased number of increments of time delayed from the time of an input signal to said power amplifier and each substantially similar in information content to said power amplifier input signal;
    amplifying each of said clone signals;
    adjusting phase relationships between amplified clone signals to a uniphase condition said adjusting including communicating each said amplified clone signal along a path of different length and differing reflection signal cancellation phasing;
    combining the amplified and in phase clone signals into a unitary output power signal.

18. The method of claim 17 wherein said amplifying step includes differing amplification degrees for successive of said clone signals.

19. The method of operating an n amplifier distributed power amplifier to achieve desirable efficiency and low output voltage standing wave ratio comprising the steps of:
    combining the output signals of said n amplifiers into a single output signal in a bilateral real-time power combining network;
    delaying each of the n input signals of the power combining network along a communicating path of predetermined differing delaying time duration and differing reflected signal cancellation phasing, said delaying step thereby generating n differently delayed combining network input signals; and
    retarding each of the n amplifier input signals with respect to the input signal of the distributed power amplifier by a differing time interval, a time interval complementing the respective of said n predetermined differing delaying time durations, said complemented delays thereby generating n phase synchronized combining network input signals;
    whereby large output voltage standing wave ratio contributing reflection signals communicated via said bilateral combining network, and reflected from the n amplifiers are cancelled by phase oppositions developed in said paths of predetermined differing.delaying time duration.

20. The method of claim 19 further including the steps of:
    driving each of said n amplifiers with equal excitation signals; and
    terminating each active element in said amplifiers with an optimum load impedance.

* * * * *

UNITED STATES PATENT AND TRADEMARK OFFICE
CERTIFICATE OF CORRECTION

PATENT NO. : 5,070,304

DATED : December 3, 1991

INVENTOR(S) : Mike L. Salib et al

It is certified that error appears in the above-identified patent and that said Letters Patent is hereby corrected as shown below:

```
Col 1, line 40, the fourth "[" should be --]--.
Col 1, line 67, "refinement" should read --refinements--.
Col 3, line 53, "sign" should read --signal.--.
Col 3, line 56, "blocked" should read --block--.
Col 7, line 68, a dash should follow "frequency".
Col 8, line 41, the hyphen should be a dash.
Col 10, line 41, "solid state" should be deleted.
Col 10, line 55, "two-layered" shouold read
     --output to input--.
```

Signed and Sealed this

Sixteenth Day of March, 1993

Attest:

STEPHEN G. KUNIN

*Attesting Officer*   *Acting Commissioner of Patents and Trademarks*